United States Patent
Yang et al.

(10) Patent No.: US 11,818,955 B2
(45) Date of Patent: Nov. 14, 2023

(54) METHOD FOR FORMING PIEZOELECTRIC FILMS ON SURFACES OF ARBITRARY MORPHOLOGIES

(71) Applicant: City University of Hong Kong, Hong Kong (CN)

(72) Inventors: Zhengbao Yang, Hong Kong (CN); Shiyuan Liu, Hong Kong (CN)

(73) Assignee: City University of Hong Kong, Hong Kong (CN)

( * ) Notice: Subject to any disclaimer, the term of this patent is extended or adjusted under 35 U.S.C. 154(b) by 62 days.

(21) Appl. No.: 17/445,959

(22) Filed: Aug. 26, 2021

(65) Prior Publication Data
US 2023/0066205 A1    Mar. 2, 2023

(51) Int. Cl.
*H10N 30/00* (2023.01)
*H10N 30/045* (2023.01)
*H10N 30/078* (2023.01)
*H10N 30/88* (2023.01)
*H10N 30/853* (2023.01)

(52) U.S. Cl.
CPC ..... *H10N 30/10513* (2023.02); *H10N 30/045* (2023.02); *H10N 30/078* (2023.02); *H10N 30/883* (2023.02); *H10N 30/8536* (2023.02)

(58) Field of Classification Search
None
See application file for complete search history.

(56) References Cited

U.S. PATENT DOCUMENTS

| | | | |
|---|---|---|---|
| 5,116,643 A | 5/1992 | Miller et al. | |
| 5,585,136 A | 12/1996 | Barrow et al. | |
| 5,626,670 A | 5/1997 | Varshney et al. | |
| 6,335,207 B1 | 1/2002 | Joo et al. | |
| 6,386,053 B1 * | 5/2002 | Takeuchi | H01L 41/0973 73/865 |
| 8,465,810 B2 | 6/2013 | Umino | |
| 2004/0178178 A1 * | 9/2004 | Blohowiak | C23C 18/1241 216/89 |

(Continued)

FOREIGN PATENT DOCUMENTS

| | | |
|---|---|---|
| EP | 2784804 A1 | 10/2014 |
| WO | 2014/093265 A1 | 11/2018 |

OTHER PUBLICATIONS

Susan et al., "Efficient piezoelectric energy harvesters utilizing (001) textured bimorph PZT films on flexible metal foils", in Advanced Functional Materials 26.32 (2016): 5940-5946.

(Continued)

*Primary Examiner* — Erica S Lin
(74) *Attorney, Agent, or Firm* — S&F/WEHRW

(57) ABSTRACT

The present disclosure provides a method for forming piezoelectric films on surfaces of arbitrary morphologies. The method includes providing a sol for forming the piezoelectric film; spraying the sol onto the surface thereby forming a liquid film containing the sol on the surface; wiping the liquid film with a flattening tool for flattening the liquid film; drying the flattened liquid film thereby forming a gel layer; and annealing the gel layer thereby forming the piezoelectric film. The piezoelectric films with high uniformity and desired thickness can be formed on curved and even wrinkled surfaces by the present method.

18 Claims, 15 Drawing Sheets

(56) References Cited

U.S. PATENT DOCUMENTS

| | | | | |
|---|---|---|---|---|
| 2012/0038712 A1* | 2/2012 | Akiyama | ............ | H01L 41/0973 |
| | | | | 347/54 |
| 2015/0268198 A1* | 9/2015 | Simonet | ................ | G01N 29/28 |
| | | | | 204/192.12 |
| 2015/0368161 A1* | 12/2015 | Murakami | ........... | B41J 2/14233 |
| | | | | 310/365 |
| 2016/0133826 A1 | 5/2016 | Yao et al. | | |

OTHER PUBLICATIONS

Pritish et al., "Hierarchically Ordered Nano-Heterostructured PZT Thin Films with Enhanced Ferroelectric Properties", Advanced Functional Materials 24.18 (2014): 2638-2647.

Li et al., "c-axis oriented epitaxial BaTiO3 films on (001) Si", Journal of Applied Physics 100.2 (2006): 024108.

Park et al., "Highly-efficient, flexible piezoelectric PZT thin film nanogenerator on plastic substrates", Advanced materials 26.16 (2014): 2514-2520.

Ko et al., "Flexible Pb (Zr0. 52Ti0. 48) O3 films for a hybrid piezoelectric-pyroelectric nanogenerator under harsh environments", ACS applied materials & interfaces 8.10 (2016): 6504-6511.

Won et al., "Flexible vibrational energy harvesting devices using strain-engineered perovskite piezoelectric thin films", Nano Energy 55 (2019): 182-192.

Park et al., "Piezoelectric flexible energy harvester based on BaTiO3 thin film enabled by exfoliating the mica substrate", Energy Technology 7.10 (2019): 1900638.

\* cited by examiner

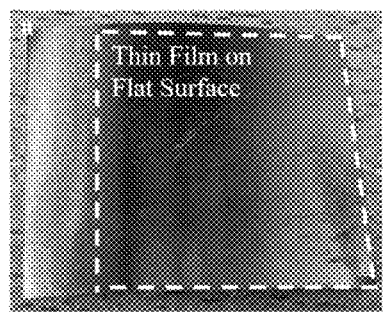 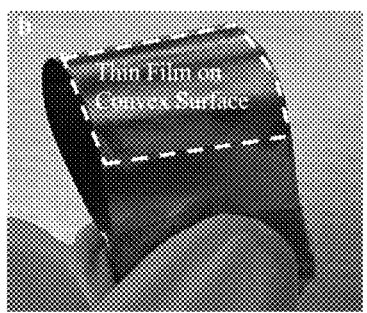 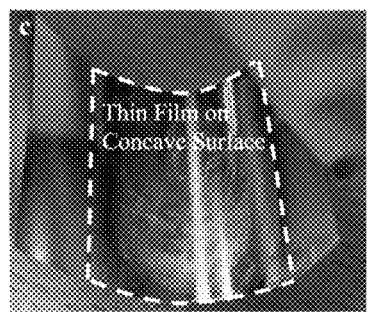
FIG. 5A  FIG. 5B  FIG. 5C
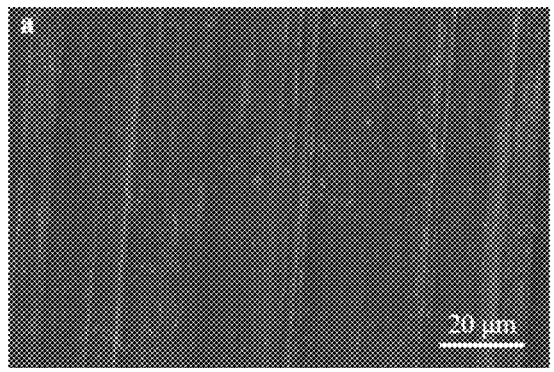 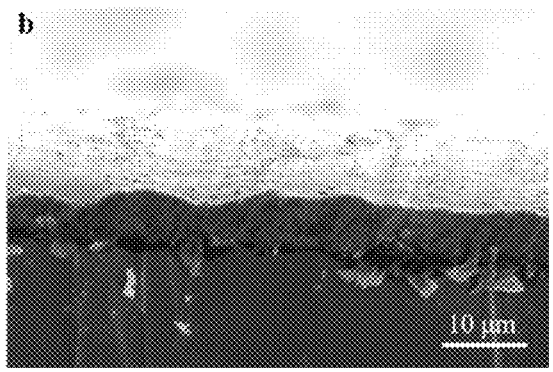
FIG. 6A  FIG. 6B
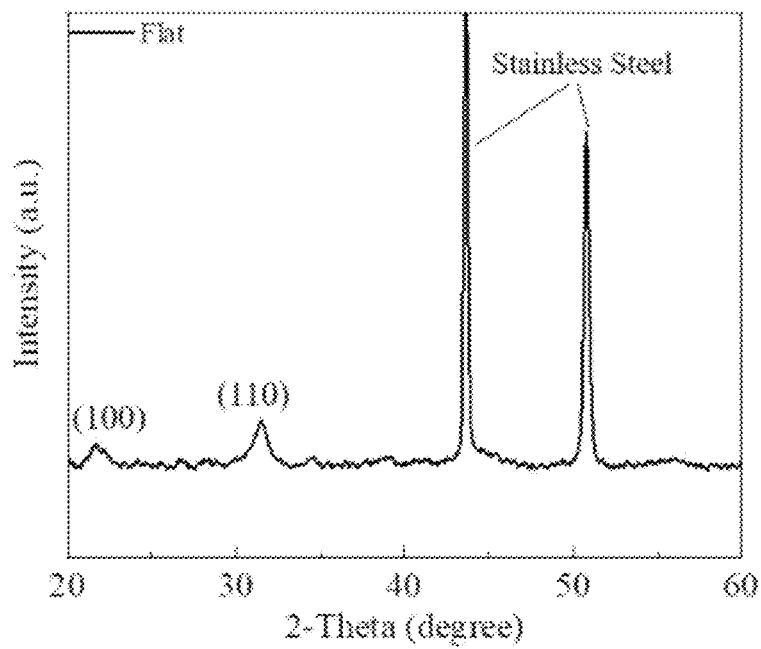
FIG. 7A

METHOD FOR FORMING PIEZOELECTRIC FILMS ON SURFACES OF ARBITRARY MORPHOLOGIES

TECHNICAL FIELD

The present disclosure relates to a method for forming piezoelectric films on surfaces of arbitrary morphologies.

BACKGROUND

Piezoelectric elements can be used on the surfaces of aircrafts, vessels, and vehicles for multiple purposes such as antifouling, acoustic transduction, energy harvesting, and structural health monitoring. However, existing piezoelectric elements are mainly in fixed geometries such as flat sheets, disks, or tubes. They cannot fully fit the arbitrarily curved substrate surfaces without a buffer layer or surface grinding.

A need therefore exists for an improved method that eliminates or at least diminishes the disadvantages and problems described above.

SUMMARY

Provided herein is a method for forming a piezoelectric film on a surface of a substrate, the method comprising: a) providing a sol for forming the piezoelectric film; b) spraying the sol onto the surface thereby forming a liquid film containing the sol on the surface; c) wiping the liquid film with a flattening tool for flattening the liquid film; d) drying the flattened liquid film thereby forming a gel layer; and e) annealing the gel layer thereby forming the piezoelectric film or a sublayer of the piezoelectric film.

In certain embodiments, the flattening tool is a roller, a blade or a bush.

In certain embodiments, the step of wiping the liquid film comprises rolling the roller on the liquid film.

In certain embodiments, the step of wiping the liquid film comprises sliding the blade or the brush on the liquid film.

In certain embodiments, a distance is maintained between the surface and the flattening tool for defining a thickness of the flattened liquid film during the step of wiping the liquid film with the flattening tool.

In certain embodiments, the distance is larger than 500 nm.

In certain embodiments, the liquid film is wiped for further removing excess sol from the liquid film.

In certain embodiments, the method further comprises repeating the steps (b)-(e) for forming one or more subsequent sublayers of the piezoelectric film until the piezoelectric film is formed.

In certain embodiments, the sublayer has a thickness of 500 nm to 1 μm; and the piezoelectric film has a thickness larger than 5 μm.

In certain embodiments, the flattened liquid film is dried with a hot air gun.

In certain embodiments, the method further comprises activating the surface by oxygen ions for modifying lyophobicity of the surface prior to the step of spraying the sol onto the surface.

In certain embodiments, the surface is a concave surface, a convex surface, a wrinkled surface, a curved surface or a flat surface.

In certain embodiments, the piezoelectric film comprises barium titanate ($BaTiO_3$), barium calcium zirconium titanate (BCZT), lead zirconate titanate (PZT), zinc oxide (ZnO) or lead magnesium niobate-lead titanate (PMN-PT).

In certain embodiments, the substrate comprises a stainless steel, a titanium alloy or an aluminum alloy.

In certain embodiments, the method further comprises polarizing the piezoelectric film.

In certain embodiments, the piezoelectric film is polarized by corona polarization or direct polarization.

In certain embodiments, the method further comprises forming one or more electrodes on the piezoelectric film.

In certain embodiments, the one or more electrodes are formed by magnetron sputtering, thermal evaporation, electron beam evaporation, a silver paste or a conductive tape.

In certain embodiments, the method further comprises forming a protective layer on the one or more electrodes.

In certain embodiments, the protective layer is formed by blade coating.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects of the present invention are disclosed as illustrated by the embodiments hereinafter.

BRIEF DESCRIPTION OF DRAWINGS

The appended drawings, where like reference numerals refer to identical or functionally similar elements, contain figures of certain embodiments to further illustrate and clarify the above and other aspects, advantages and features of the present invention. It will be appreciated that these drawings depict embodiments of the invention and are not intended to limit its scope. The invention will be described and explained with additional specificity and detail through the use of the accompanying drawings in which:

FIG. 5A is a photograph showing a BCZT thin film coated on a flat surface of a stainless steel substrate;

FIG. 5B is a photograph showing a BCZT thin film coated on a convex surface of a stainless steel substrate;

FIG. 5C is a photograph showing a BCZT thin film coated on the concave surface of a stainless steel substrate;

FIG. 6A is a scanning electron microscope (SEM) image showing the top surface morphology of a BCZT thin film coated on a concave surface of a stainless steel substrate;

FIG. 6B is an SEM image showing the cross-sectional view of the BCZT thin film and stainless steel substrate;

FIG. 7A shows a XRD spectrum of a BCZT thin film coated on a flat stainless steel surface;

Skilled artisans will appreciate that elements in the figures are illustrated for simplicity and clarity and have not necessarily been depicted to scale.

DETAILED DESCRIPTION OF THE INVENTION

It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

The present disclosure provides a method for forming piezoelectric thin films on complex surfaces of substrates. In certain embodiments, the method comprises sol-gel solution preparation, surface activation, solution atomization, brush or roller wiping and rapid annealing. The prepared solution has low viscosity to be easily atomized to coat onto the surfaces of arbitrary morphologies. The surface activation process can be used to form a uniform and densified thin film. The post brush or roller wiping is used to obtain a thin film with an even thickness. By fabricating piezoceramic thin films on surfaces of arbitrary morphologies, the piezoceramic thin films are able to serve as the functional layer on various substrates, even on vehicles, vessels, aircraft and etc. This method is adaptable for various common piezoceramic thin films, e.g., $BaTiO_3$, $(Ba, Ca)(Zr, Ti)O_3$ and PZT. The thin films formed on stainless steel surfaces of arbitrary morphologies have good piezoelectric responses, and their piezoelectric performances are evaluated and evidenced.

In certain embodiments, the sol-gel solution of a piezoelectric thin film is spray-coated on a substrate with irregular morphologies and dried by a hot air gun. The sintering process is conducted by rapid thermal annealing. This manufacturing method provides piezoelectric thin films with arbitrary shapes that are reliable, repeatable, and highly controllable. The improved piezoelectric performances have been characterized and evidenced. The as-prepared piezoelectric thin films can be used for multiple energy transducers, e.g., transducers, sensors and energy harvesters.

Figure 1:
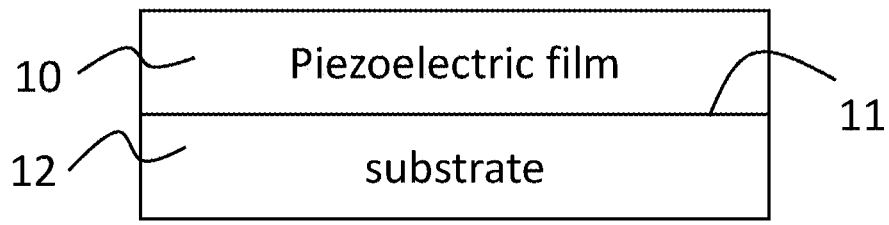
FIG. 1 is a schematic diagram depicting a piezoelectric film formed on a surface of a substrate according to certain embodiments.

As shown in FIG. 1, a piezoelectric film 10 is formed on a surface 11 of a substrate 12 according to certain embodiments. The piezoelectric film 10 may be a piezoceramic film comprising $BaTiO_3$, BCZT, or PZT. The piezoelectric film 10 may have a thickness larger than 5 μm. The substrate 12 may be but not limited to a stainless steel substrate with arbitrary shapes. The surface 11 may have arbitrary morphologies and can be a concave surface, a convex surface, a curved surface, a wrinkled surface or a flat surface.

Figure 2:
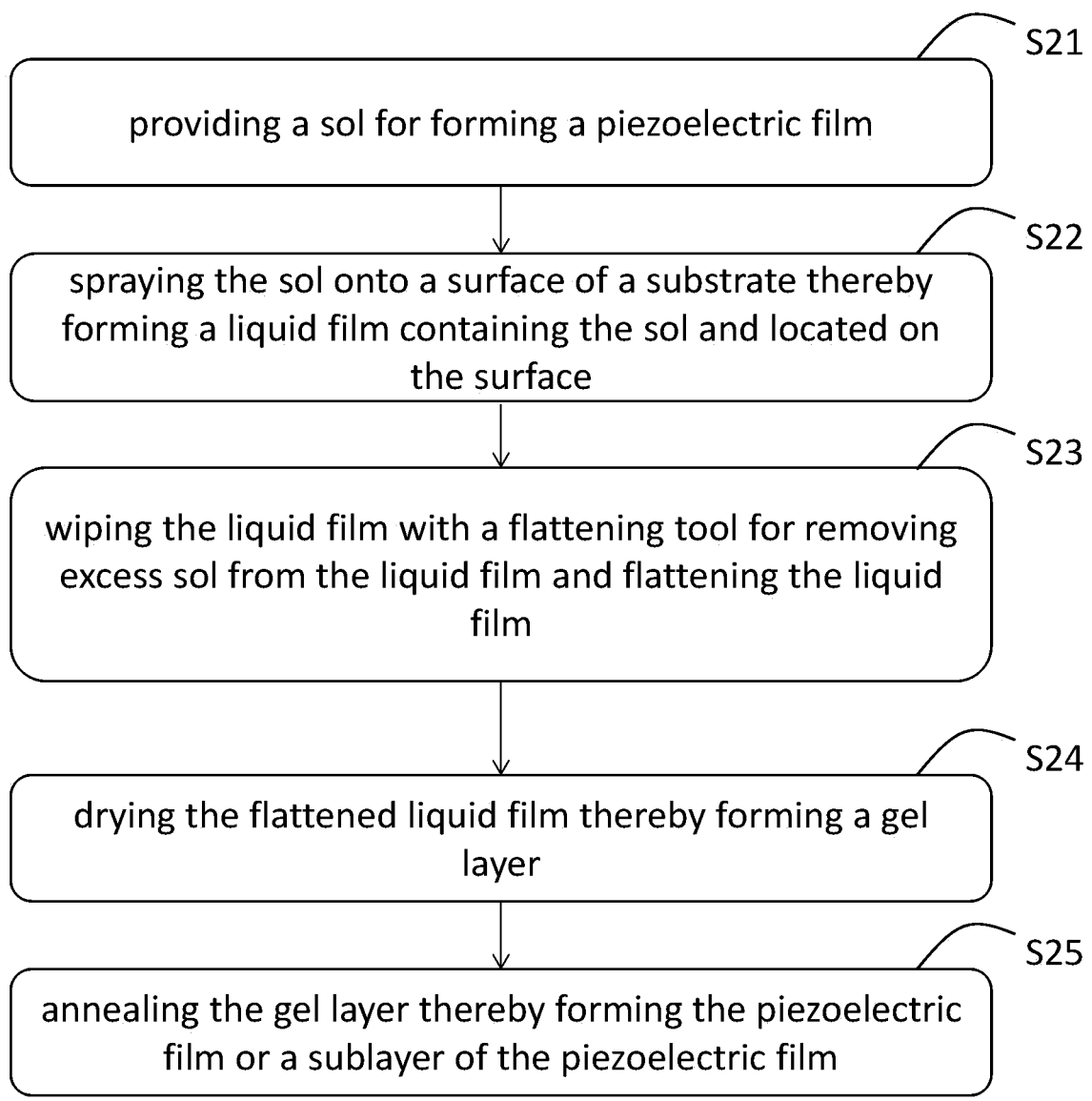
FIG. 2 is a flow chart depicting a method for forming a piezoelectric film on a surface of a substrate according to certain embodiments.

FIG. 2 is a flow chart depicting a method for forming a piezoelectric film on a surface of a substrate according to certain embodiments. In step S21, a sol is provided for forming the piezoelectric film. In step S22, the sol is sprayed onto the surface thereby forming a liquid film containing the sol and located on the surface. In step S23, the liquid film is wiped with a flattening tool for removing excess sol from the liquid film and flattening the liquid film such that a uniform and flattened liquid film with a homogeneous thickness is formed on the surface. In step S24, the flattened liquid film is dried thereby forming a gel layer. In step S25, the gel layer is annealed thereby forming the piezoelectric film or a sublayer of the piezoelectric film.

In certain embodiments, the flattening tool is a roller, a blade or a bush.

In certain embodiments, the step of wiping the liquid film comprises rolling the roller on the liquid film.

In certain embodiments, the step of wiping the liquid film comprises sliding the blade or the brush on the liquid film.

In certain embodiments, a distance is maintained between the surface and the flattening tool for defining a thickness of the flattened liquid film during the step of wiping the liquid film with the flattening tool.

In certain embodiments, the distance is larger than 500 nm.

In certain embodiments, the liquid film is wiped for further removing excess sol from the liquid film.

In certain embodiments, the method further comprises repeating steps S22-S25 for forming one or more subsequent sublayers of the piezoelectric film until the piezoelectric film is formed.

In certain embodiments, the sublayer has a thickness of 500 nm to 1 μm; and the piezoelectric film has a thickness larger than 5 μm.

In certain embodiments, the flattened liquid film is dried with a hot air gun.

In certain embodiments, the method further comprises activating the surface by oxygen ions for modifying lyophobicity of the surface prior to the step of spraying the sol onto the surface.

In certain embodiments, the surface is a concave surface, a convex surface, a wrinkled surface, a curved surface or a flat surface.

In certain embodiments, the piezoelectric film comprises barium titanate ($BaTiO_3$), barium calcium zirconium titanate (BCZT), lead zirconate titanate (PZT), zinc oxide (ZnO) or lead magnesium niobate-lead titanate (PMN-PT).

In certain embodiments, the substrate comprises a stainless steel, a titanium alloy or an aluminum alloy.

In certain embodiments, the method further comprises polarizing the piezoelectric film. The piezoelectric film can be polarized by corona polarization or direct polarization.

In certain embodiments, the method further comprises forming electrodes on the piezoelectric film. The electrodes can be formed by magnetron sputtering, thermal evaporation, electron beam evaporation, a silver paste or a conductive tape.

In certain embodiments, the method further comprises forming a protective layer on the electrodes. The protective layer can be formed by blade coating.

Figure 3:
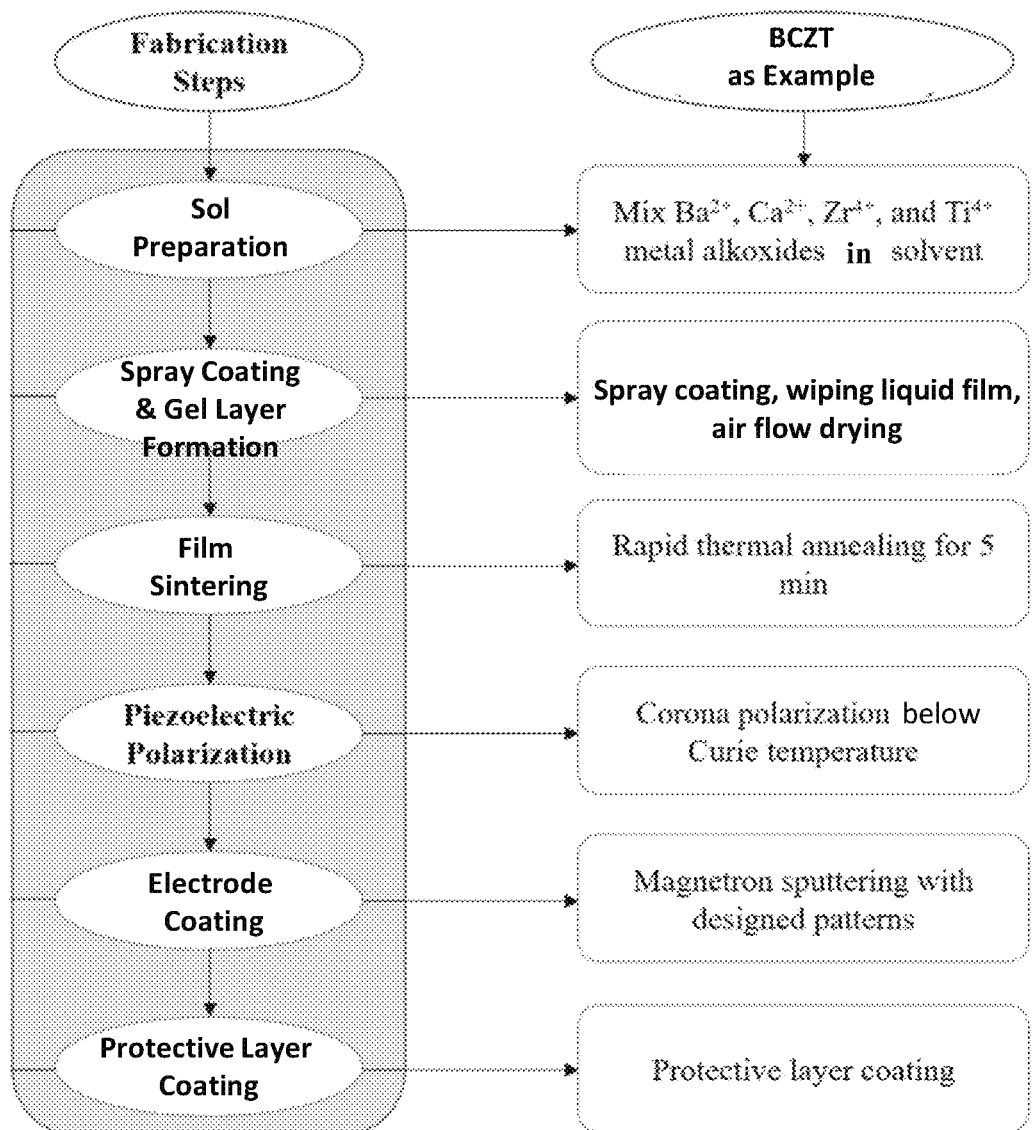
FIG. 3 shows a method for fabricating a piezoelectric thin films on a stainless steel substrates with arbitrary shapes according to certain embodiments.

FIG. 3 shows a method for fabricating a piezoelectric thin film on a stainless steel substrate with arbitrary shapes. The method includes the steps of sol preparation, spray coating and gel layer formation, film sintering, piezoelectric polarization, electrode coating, and protective layer coating.

According to an embodiment, a BCZT thin film is fabricated by this method as shown in FIG. 3. In the step of sol preparation, $Ba^{2+}$, $Ca^{2+}$, $Zr^{4+}$ and $Ti^{4+}$ metal alkoxides are mixed in a solvent to form a BCZT sol. A dilute agent can be added into the sol such that the modified sol is easy to be atomized during spraying in order to form a thin and densified layer. In the step of spray coating and gel layer formation, the BCZT sol is sprayed onto a surface of the substrate thereby forming a liquid film containing the BCZT sol on the surface. The liquid film is then wiped with a brush for removing excess BCZT sol from the liquid film and flattening the liquid film so as to form a densified piezoelectric thin film with a homogeneous thickness. The flattened liquid film is dried by air flow to evaporate the solvent from the BCZT sol thereby forming a gel layer. In the step of film sintering, the gel layer is rapidly annealed for 5 min thereby forming the BCZT thin film. In certain embodiments, the annealing temperature is raised rapidly and then the thin film is cooled down quickly to sinter the thin film. Alternatively, the annealing temperature is slowly raised and maintained at the high sintering temperature for a long time. In the step of piezoelectric polarization, the BCZT thin film is polarized by corona polarization below Curie temperature. In the step of electrode coating, electrodes with designed patterns are coated on the polarized BCZT thin film by magnetron sputtering. In the step of protective layer coating, a protective layer is coated on the electrodes.

The spray coating can effectively coat a thin film with large area on arbitrary substrates. However, only by spray coating, the sol-gel thin film is not uniform and has many pores. To overcome such problem, the surface activation procedure is implemented before coating, which will significantly improve the wettability of the substrate. After that, the as-sprayed liquid film is uniformly flattened by blades, brushes or rollers following by airflow drying. This flattening process can significantly improve film uniformity and acquire a desired film thickness.

Since the as-coated thin film may have relatively low self-polarization intensity, the polarization process can be adopted. Direct polarization or corona polarization can be adopted depending on the shape of the film. Magnetron sputtering is a preferred method to deposit the electrodes on the piezoelectric thin film. The protective layer can be made of PDMS owing to its high flexibility and chemically inert. The PDMS can be coated by blade coating.

Figure 4:
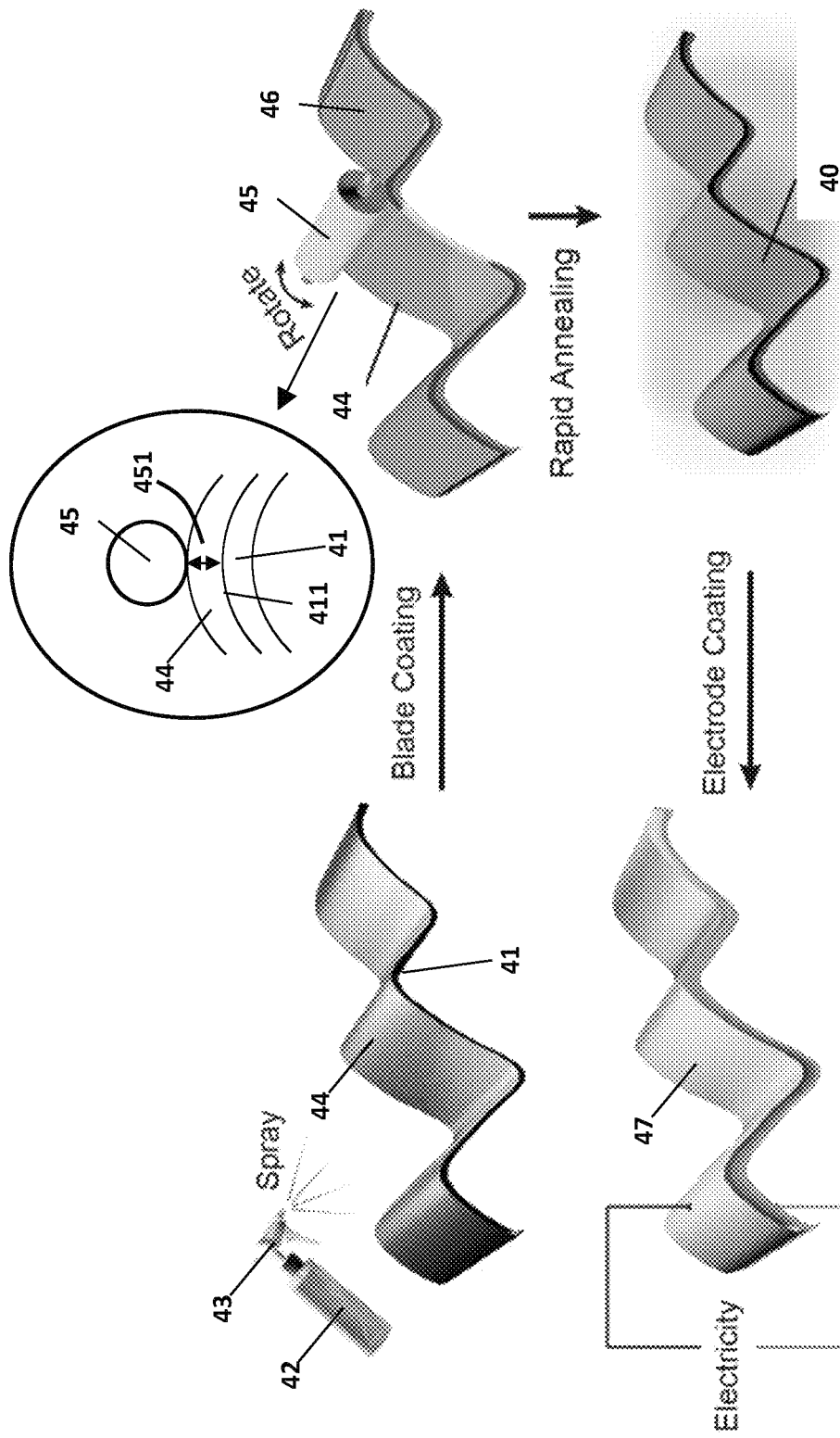
FIG. 4 shows a schematic illustration of a piezoelectric thin film formed on a curved stainless steel substrate according to certain embodiments.

FIG. 4 schematically describes a fabrication process of a piezoelectric thin film 40 on a curved stainless steel substrate 41. The curved stainless steel substrate 41 represents a substrate with arbitrary morphologies. The material of the substrate includes but is not limited to stainless steel. Any materials that allows piezoelectric ceramic thin films to be coated thereon is adaptable to this method. A sol 42 contained in a sprayer 43 is sprayed onto a surface 411 of the curved stainless steel substrate 41 to form a liquid film 44 containing the sol 42. As the as-deposited liquid film 44 may be non-uniform and contain pores, the liquid film 44 is rolled by a roller 45. The roller 45 touches and presses the liquid film 44 with a distance 451 maintained between the surface 411 and the roller 45, and rotates to move along the liquid film 44 for removing the excess sol 42 from the liquid film 44 and flattening the liquid film 44 with a defined thickness. The flattened liquid film 44 is dried to evaporate the solvent from the sol 42 to form a gel layer 46. The gel layer 46 is annealed under a rapid thermal annealing to crystallize the gel layer 46 to form the piezoelectric thin film 40. An electrode layer 47 is coated on the piezoelectric thin film 40 by magnetron sputtering. In certain embodiments, the electrode layer can be further passivated by a protective layer.

Several types of piezoelectric ceramic thin films formed on stainless steel substrates with arbitrary morphologies via sol-gel spray coating and rapid thermal annealing have been prepared as shown in examples below.

Example 1

A PZT ($PbZr_{0.52}Ti_{0.48}O_3$) sol was prepared with lead acetate trihydrate, zirconium isopropoxide and titanium isopropoxide. The lead acetate was firstly dissolved in acetic acid until the solid was fully dissolved. Titanium isopropoxide was slowly added to an appropriate amount of zirconium isopropoxide in another container at room temperature, followed by adding the solution into the first container in room temperature. The two solutions were mixed at room temperature and diluted with ethylene alcohol and distilled water to improve stability. The as-prepared sol was aged for at least 24 hours to ensure the chemical reactions to be completed.

Example 2

A BTO ($BaTiO_3$) sol was prepared with barium acetate and titanium isopropoxide. The barium acetate was firstly dissolved in acetic acid until the solid was fully dissolved. Titanium isopropoxide was slowly added to the solution at room temperature. To stabilize the solution, ethylene alcohol and distilled water were added to dilute the solution. The as-prepared sol was aged for at least 24 hours to ensure the chemical reactions to be completed.

Example 3

A BCZT ($0.5Ba(Zr_{0.2}Ti_{0.8})O_3$-$0.5Ba_{0.7}Ca_{0.3}TiO_3$) sol was prepared with barium acetate, calcium acetate, zirconium isopropoxide and titanium isopropoxide. The barium acetate was firstly dissolved in acetic acid with an appropriate amount of calcium acetate until the solid was fully dissolved. Titanium isopropoxide was slowly added to an appropriate amount of zirconium isopropoxide in another container at room temperature, followed by adding the solution into the first container in room temperature. The two solutions were mixed at room temperature and diluted with 2-methoxyethanol and distilled water to improve stability. The as-prepared sol was aged for at least 24 hours to ensure the chemical reactions to be completed.

Since the coating processes of PZT, BTO, and BCZT are similar, the following descriptions include the process of BCZT thin film coating.

Example 4

The BCZT sol was coated onto a target substrate. The prepared BCZT sol was first added to a cleaned sprayer. The substrate were washed with water before spray coating. The BCZT sol was sprayed onto a surface of the target substrate by the sprayer thereby forming a liquid film (i.e., a layer of the BCZT sol) on the surface. The liquid film was wiped by a flattening tool to form a uniform liquid film of BCZT sol. The uniform liquid film was converted into a uniform gel layer after drying by a hot air gun, such that the gel layer is thin and smooth enough to prevent cracking during the following annealing process.

Example 5

The gel layer was crystalized by annealing. The gel layer was sintered in a Muffle furnace. The temperature was raised to the crystallized temperature and maintain for a short time. The furnace was cooled down by air after this rapid thermal annealing.

The film thickness can be increased by repeating the steps of spray coating, wiping, drying and annealing. After repeating 10 times, the thin film with the thickness of 5 μm can be fabricated.

Example 6

An energy transducer device was fabricated for characterizations. As BCZT is a typical ferroelectric material, the piezoelectric performance can be improved by the polarization process. The BCZT thin film was placed in the corona polarization apparatus and polarized under an electric field for a long time through the thickness direction. The stainless steel substrate served as a bottom electrode. The silver paste served as the top electrode was applied on the BCZT thin film for further electric performance characterizations.

FIGS. 5A-5C shows three photographs of BCZT thin films coated on three stainless steel substrates with three different morphologies including a flat surface, a convex surface and a concave surface respectively. The BCZT thin films are flexible and transparent on the stainless steel substrates. No cracks are observed on all three samples.

FIGS. 6A and 6B shows SEM images of a BCZT thin film coated on a concave surface of a stainless steel substrate. FIG. 6A shows the top surface morphology of the BCZT thin film and FIG. 6B shows the cross-sectional view of the BCZT thin film and the stainless steel substrate. The surface of the stainless steel substrate is not flat and shows wrinkled stripes. The BCZT thin film uniformly covers the stainless steel surface without cracks and pores. The average thickness of the BCZT thin film reaches 8 μm. No obvious cracks or pores can be observed on the BCZT thin film.

Figure 7B:
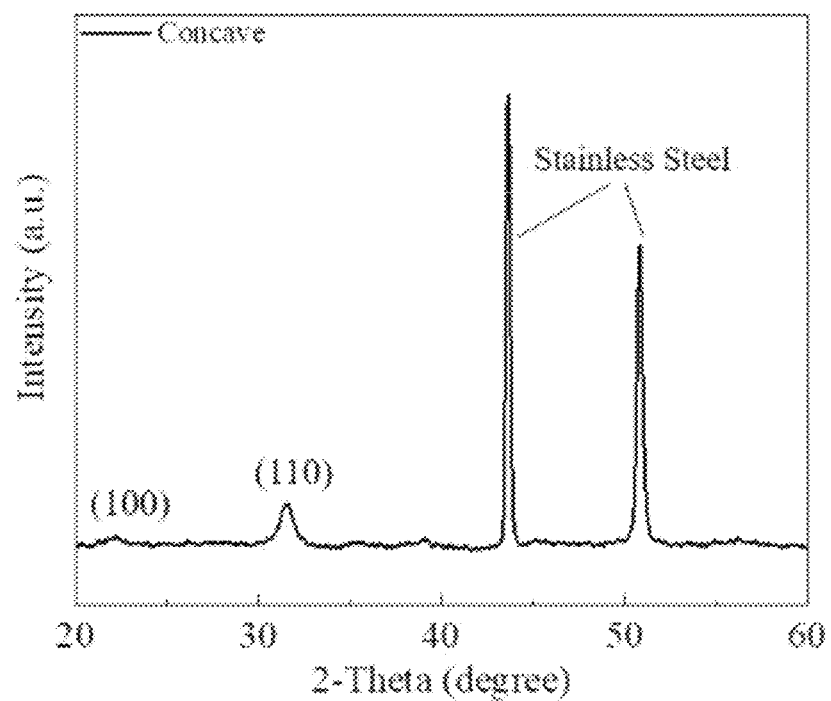
FIG. 7B shows a XRD spectrum of a BCZT thin film coated on a concave stainless steel surface.
Figure 7C:
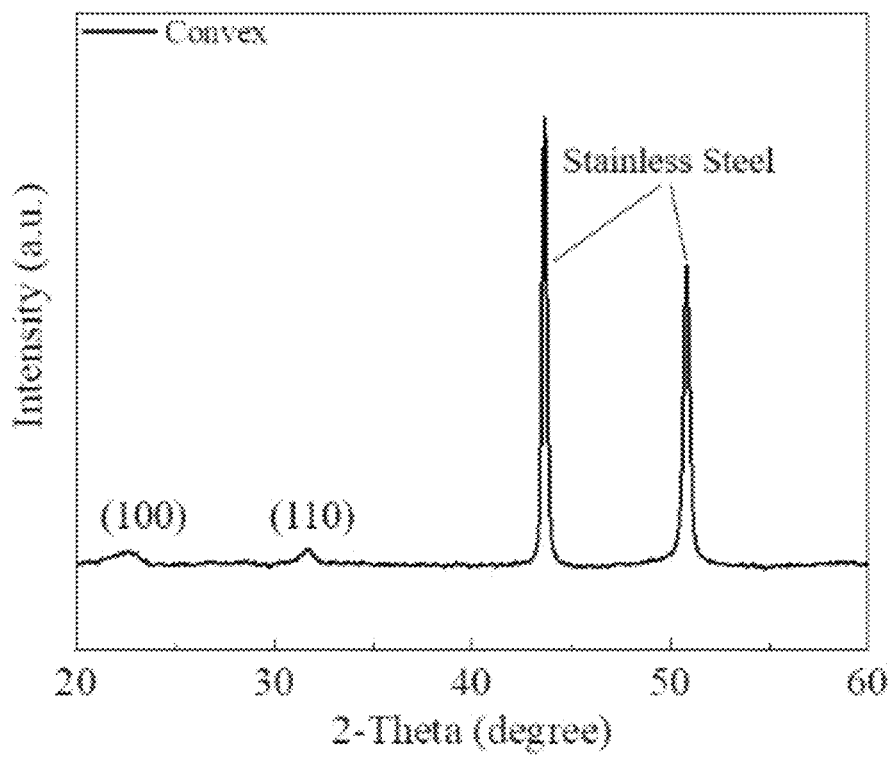
FIG. 7C shows a XRD spectrum of a BCZT thin film coated on a convex stainless steel surface.

FIGS. 7A-7C show the XRD patterns of BCZT thin films coated on flat, concave and convex stainless steel surfaces respectively. The characteristic peaks of the stainless steel are far more intense than those from the BCZT thin films because the thickness of the stainless steel substrate is much larger than the BCZT thin film. However, the (100) and (110) peaks are still obvious in all figures which indicate the BCZT thin films are well formed on the flat, concave and convex surfaces.

Figure 8A:
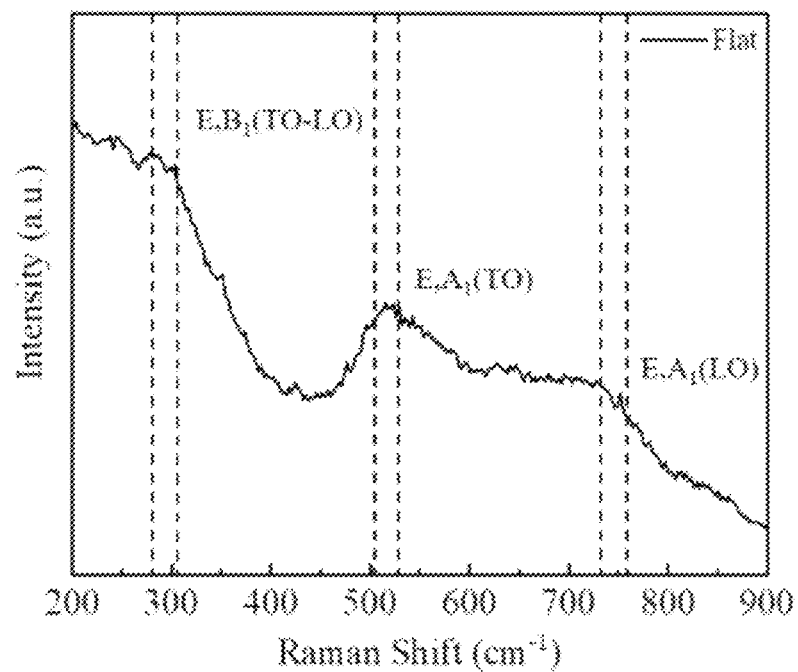
FIG. 8A shows a Raman spectrum of a BCZT thin film coated on a flat stainless steel surface.
Figure 8B:
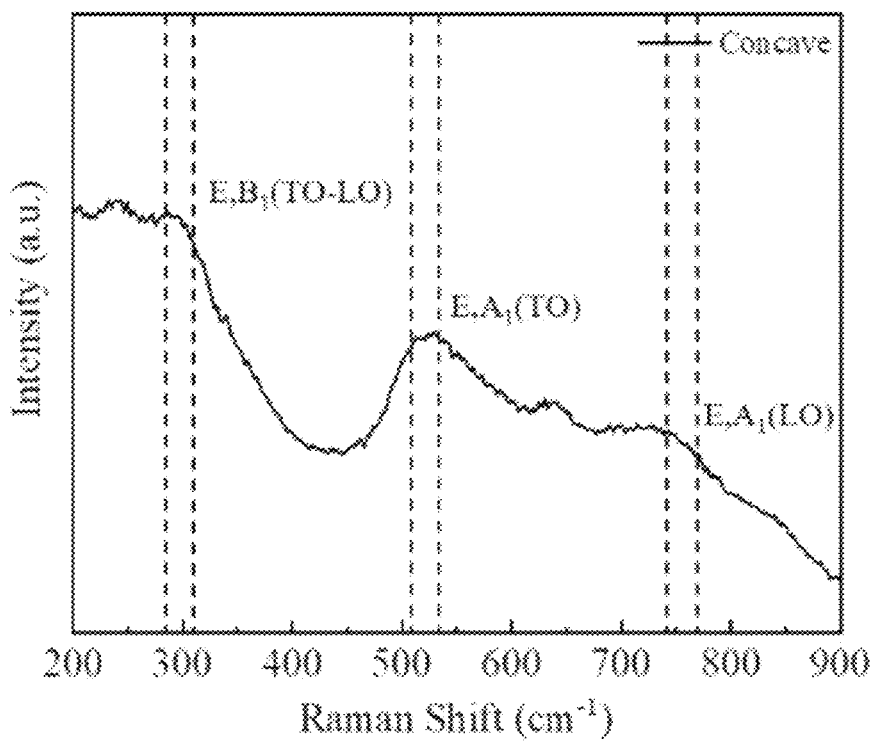
FIG. 8B shows a Raman spectrum of a BCZT thin film coated on a concave stainless steel surface.
Figure 8C:
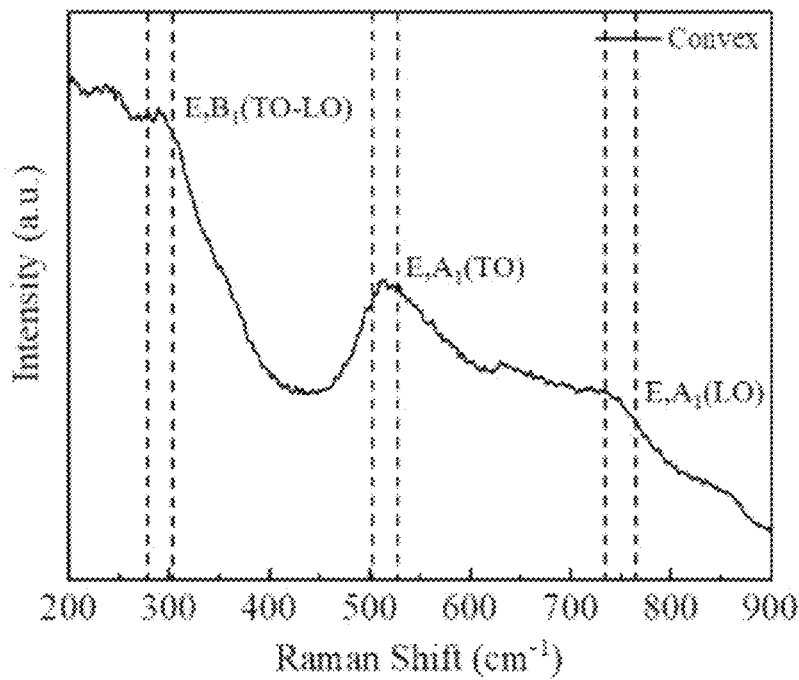
FIG. 8C shows a Raman spectrum of a BCZT thin film coated on a convex stainless steel surface.

FIGS. 8A-8C show the Raman spectrum of the BCZT thin films coated on flat, concave and convex stainless steel surfaces respectively. The scattering bands of $B_1$, E(TO+LO) near 300 $cm^{-1}$, E, $A_1$(TO) near 520 $cm^{-1}$, and E, $A_1$(LO) near 720 $cm^{-1}$ are corresponding to the tetragonal phase in the perovskite structure of the BCZT thin films, which exhibit the good crystallinity of the BCZT thin films.

Figure 9:
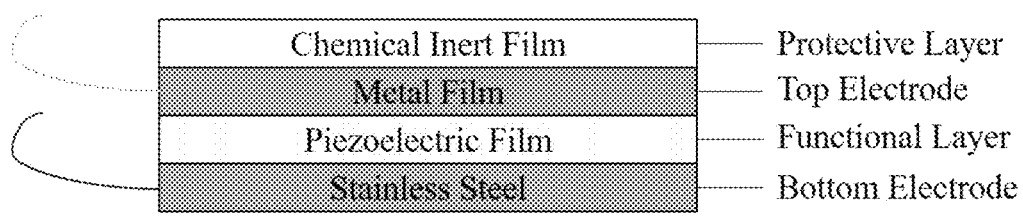
FIG. 9 is a schematic diagram depicting an energy harvester/piezoelectric sensor.

FIG. 9 shows a device structure for measuring the piezoelectric performance of the thin film coated on stainless steel substrates with various morphologies. The device includes a bottom electrode, a functional layer, a top electrode and a protective layer, which are stacked together. Due to the high conductivity of stainless steel, the substrate itself serves as the bottom electrode for conducting electricity. The functional layer is a piezoelectric film. The top electrode comprises a layer of metal film deposited from magnetron sputtering. The device is finally covered by a chemical inert film as the protective layer to prevent the metal film from oxidization and thin film breaking. The Cu wires are connected to the top and bottom electrode by silver paste. For thin film grown on a flat surface, the structure is relatively easy to be fabricated. Before conducting piezoelectric performance measurement, the samples were required to be polarized as described in FIG. 3. Owing to the high conductivity of the stainless steel, the substrate directly served as the bottom electrode and no extra bottom electrode material was required. The piezoelectric thin film was formed on the stainless steel substrate and covered by a layer of metal film as the top layer. Two conductive wires were connected to both sides of the electrodes to build a circuit for piezoelectric output measurement. Finally, one protective layer was coated on the surface of the top electrode to protect the device.

Figure 10A:
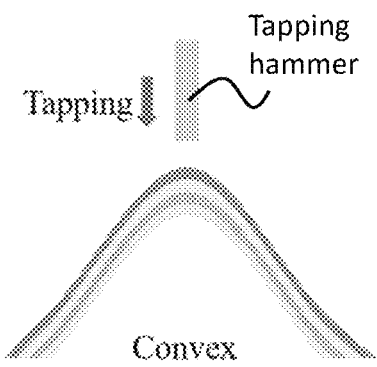
FIG. 10A shows a piezoelectric output measurement method for a thin film with a convex shape.
Figure 10B:
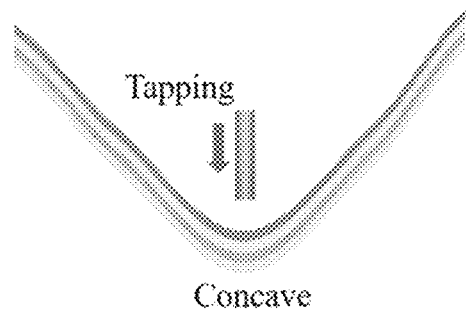
FIG. 10B shows another piezoelectric output measurement method for a thin film with a concave shape.

FIGS. 10A and 10B schematically show the piezoelectric performance measurement for the samples that are not flat. The device shown in FIG. 9 can be directly placed under a tapping hammer as shown in these figures. For the convex and concave samples with a thin film, the two sides of the convex substrate are fixed by two identical fixtures. The piezoelectric signals are generated from the mechanical deformation on the tips of the curved surfaces.

Figure 11A:
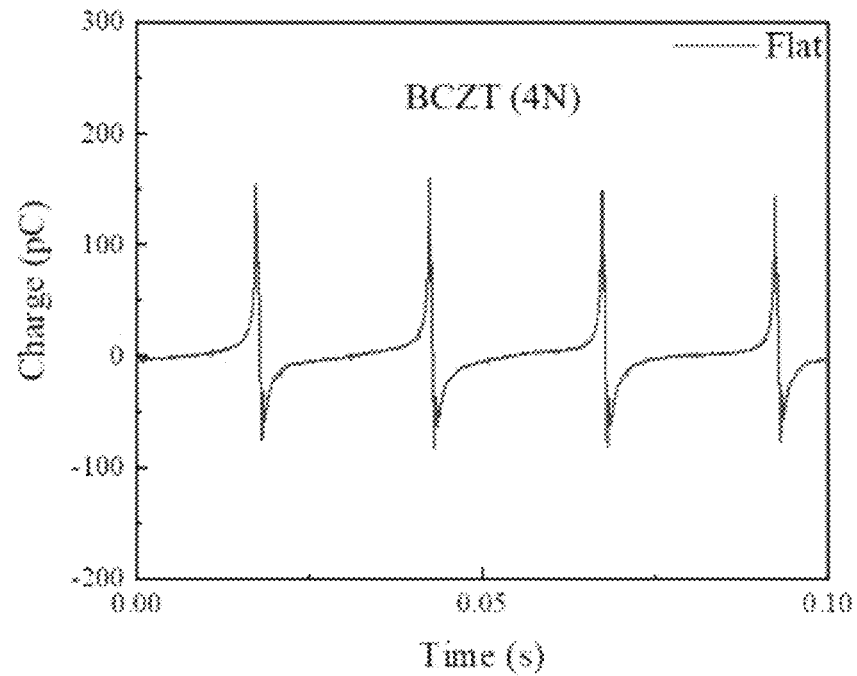
FIG. 11A shows a piezoelectric parameter $d_{33}$ measurement result for a BCZT thin film coated on a flat stainless steel surface.
Figure 11B:
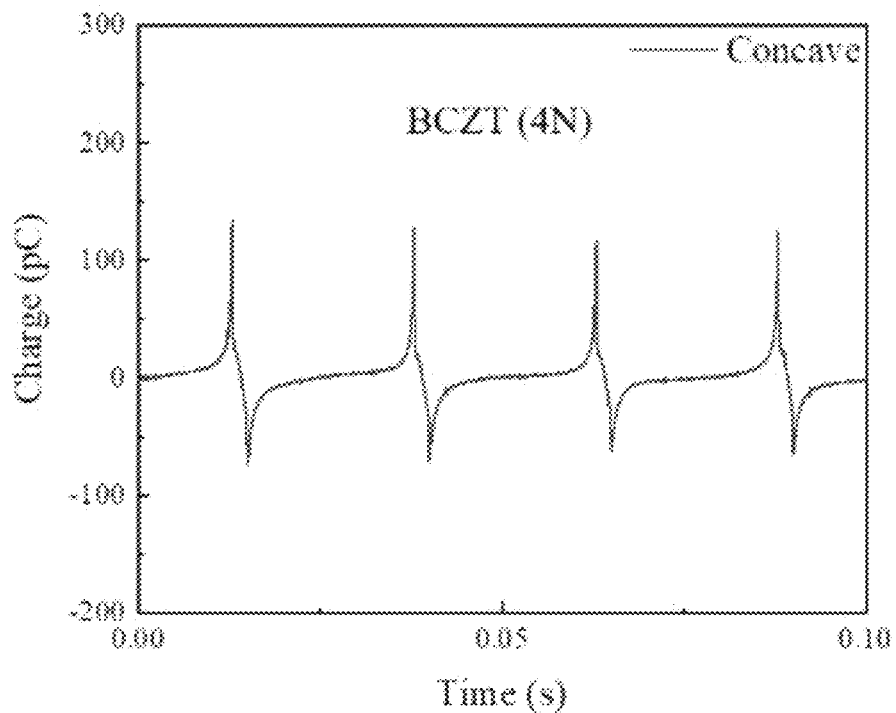
FIG. 11B shows a piezoelectric parameter $d_{33}$ measurement result for a BCZT thin film coated on a concave stainless steel surface.
Figure 11C:
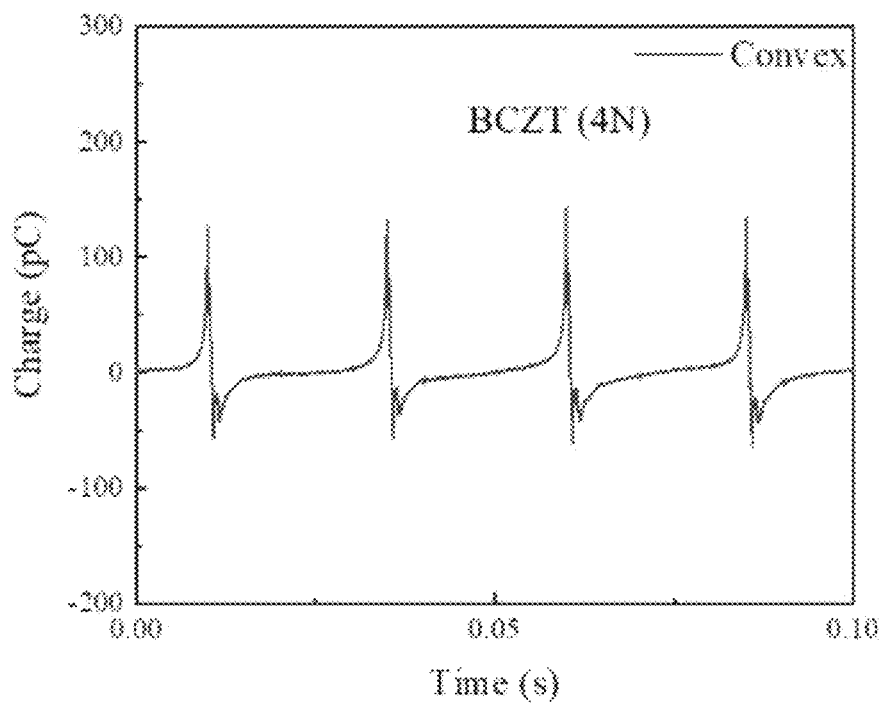
FIG. 11C shows a piezoelectric parameter $d_{33}$ measurement result for a BCZT thin film coated on a convex stainless steel surface.

FIGS. 11A-11C show the measured $d_{33}$ value of BCZT thin films coated on flat, concave and convex stainless steel surfaces respectively. The sample was placed under a hammer with a force sensor. The sensor recorded the force between the hammer tip and the sample in real-time. A charge amplifier was connected to the sample to measure the charge generated from the tapping stimulation. The value of $d_{33}$ was calculated by the division of the generated charges and the difference of the forces. The $d_{33}$ of the BCZT thin film coated on the flat surface is 40.0 pC/N. The $d_{33}$ of the BCZT thin film coated on the concave surface is 33.7 pC/N. The $d_{33}$ of the BCZT thin film coated on the convex surface is 35.7 pC/N. The average $d_{33}$ of BCZT thin films coated on the surfaces of arbitrary morphologies is 36.5 pC/N.

Figure 12A:
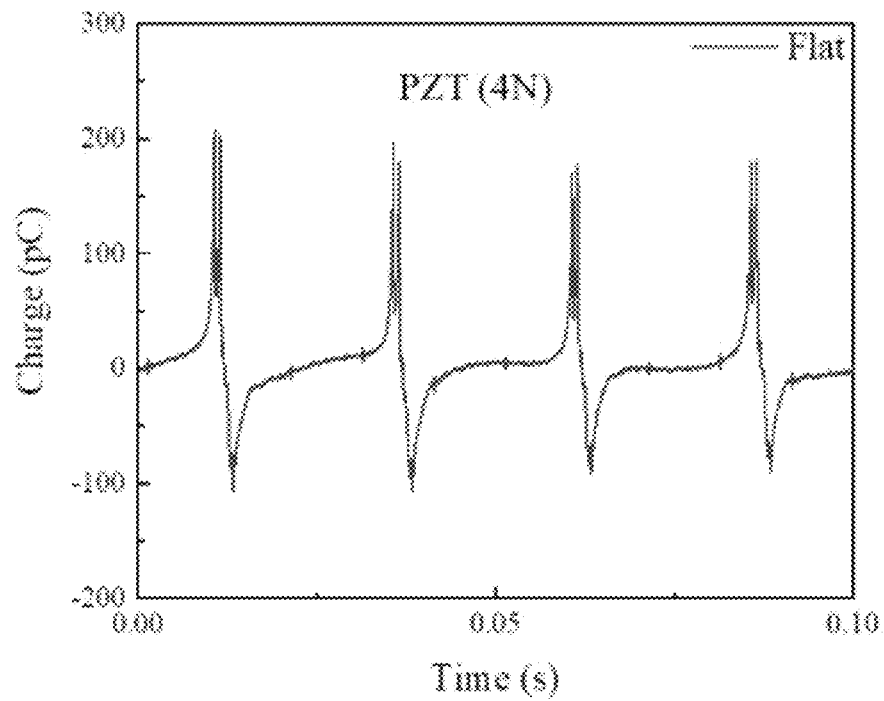
FIG. 12A shows a piezoelectric parameter $d_{33}$ measurement result for a PZT thin film coated on a flat stainless steel surface.
Figure 12B:
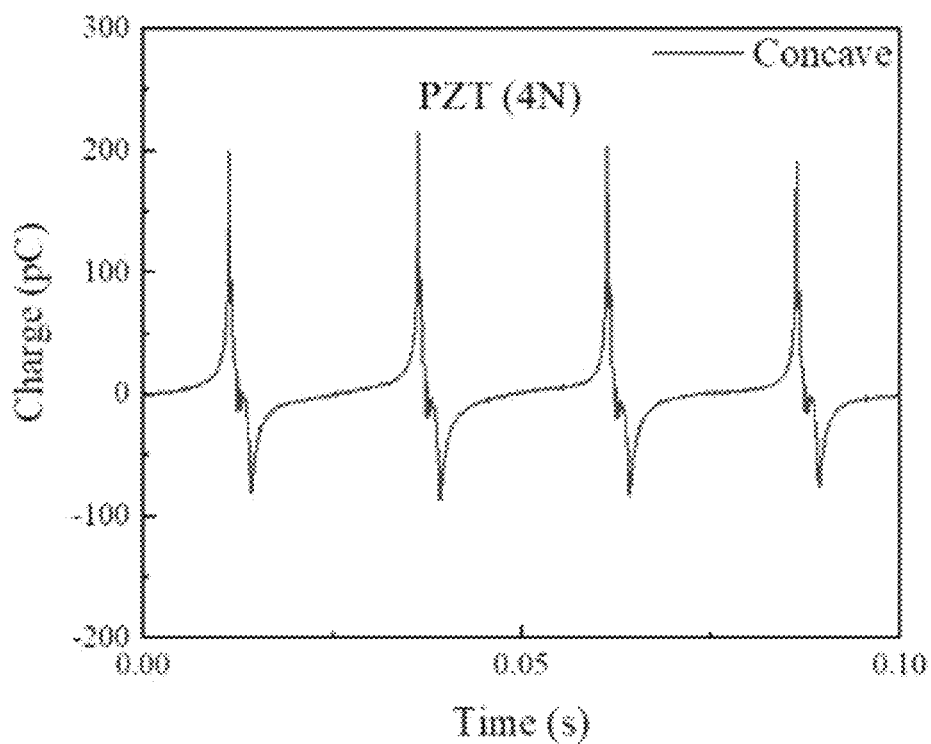
FIG. 12B shows a piezoelectric parameter $d_{33}$ measurement result for a PZT thin film coated on a concave stainless steel surface.
Figure 12C:
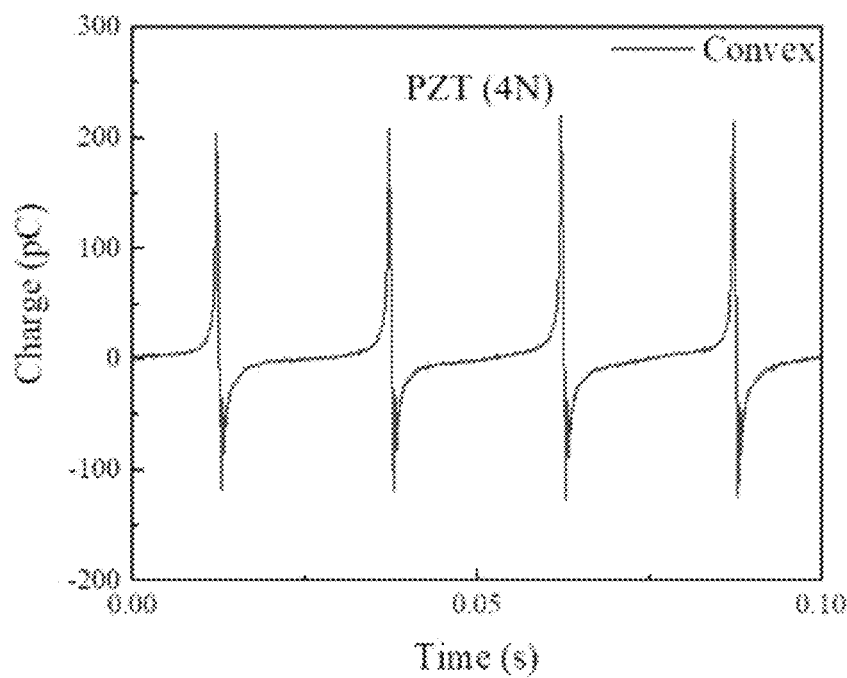
FIG. 12C shows a piezoelectric parameter $d_{33}$ measurement result for a PZT thin film coated on a convex stainless steel surface.

FIGS. 12A-12C show the measured $d_{33}$ value of the PZT thin films coated on flat, concave and convex stainless steel surfaces respectively. The method for measuring $d_{33}$ is the same to that of BCZT. The $d_{33}$ of the PZT thin film coated on the flat surface is 51.9 pC/N. The $d_{33}$ of the PZT thin film coated on the concave surface is 53.7 pC/N. The $d_{33}$ of the PZT thin film coated on the convex surface is 53.6 pC/N. The average $d_{33}$ of the BCZT thin films coated on the surfaces of arbitrary morphologies is 53.1 pC/N.

Figure 13A:
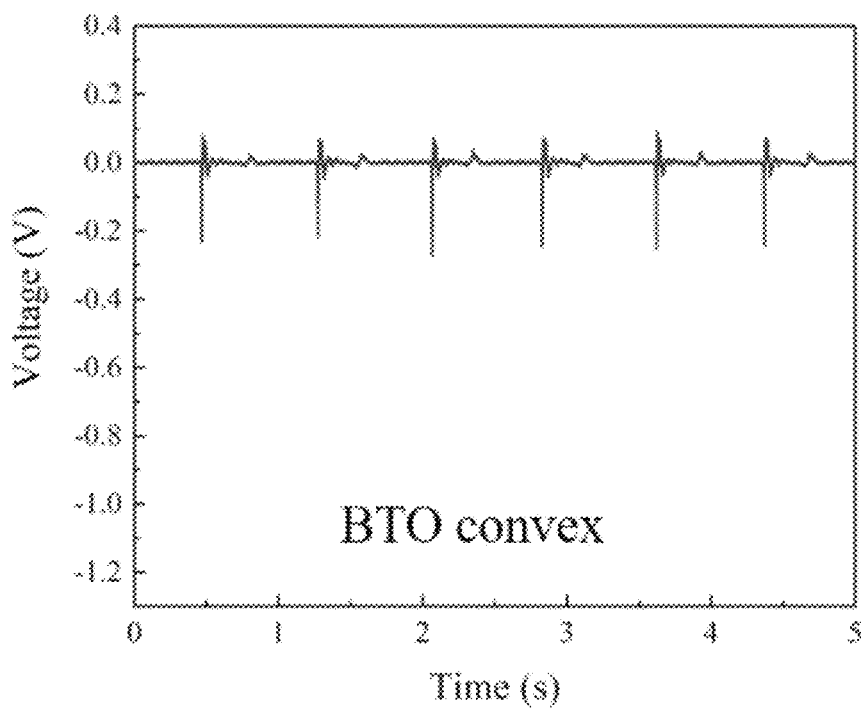
FIG. 13A shows piezoelectric performance under tapping stimulation of a BTO thin film coated on a convex stainless steel surface.
Figure 13B:
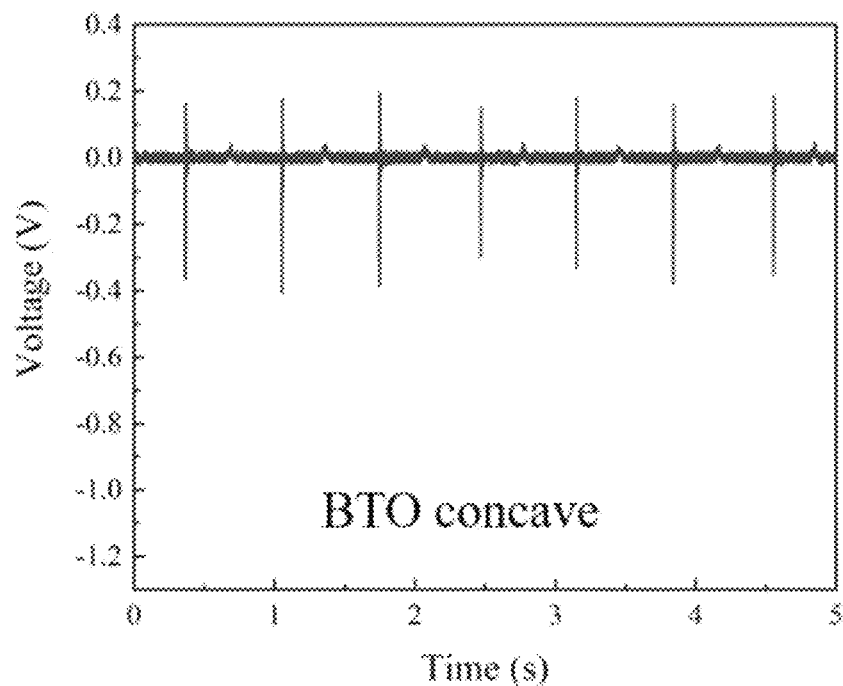
FIG. 13B shows piezoelectric performance under tapping stimulation of a BTO thin film coated on a concave stainless steel surface.

FIGS. 13A and 13B show the open-circuit piezoelectric output of BTO thin films coated on a convex stainless steel surface and a concave stainless steel surface respectively. The average output is 0.2 V for the BTO thin film coated on the convex surface and 0.3 V for the BTO thin film coated on the concave surface. The stimulation method was performed by tapping the surface by hand.

Figure 14A:
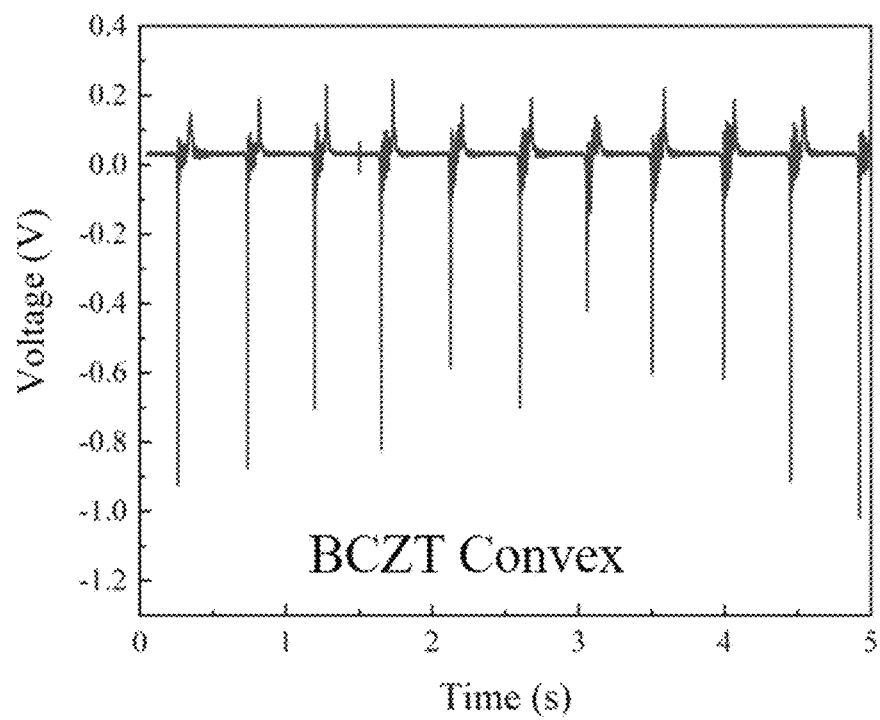
FIG. 14A shows piezoelectric performance under tapping stimulation of a BCZT thin film coated on a convex stainless steel surface.
Figure 14B:
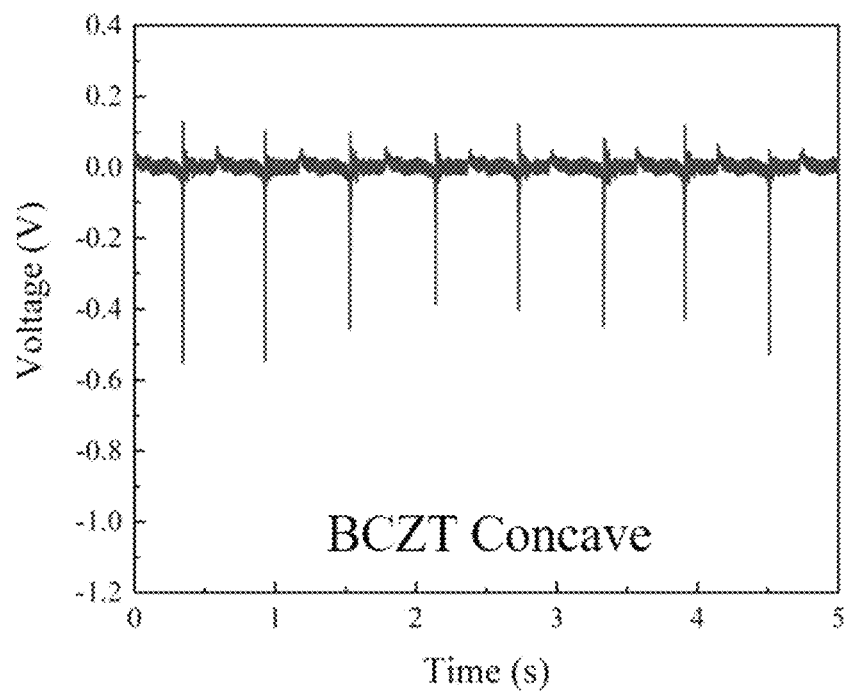
FIG. 14B shows piezoelectric performance under tapping stimulation of a BCZT thin film coated on a concave stainless steel surface.

FIGS. 14A and 14B show the open-circuit piezoelectric output from BCZT thin films coated on a convex stainless steel surface and a concave stainless steel surface respectively. The average output is 0.6 V for the BCZT thin film coated on the convex surface and 0.4 V for the BCZT thin film coated on the concave surface. The stimulation method was performed by tapping the surface by hand.

Figure 15A:
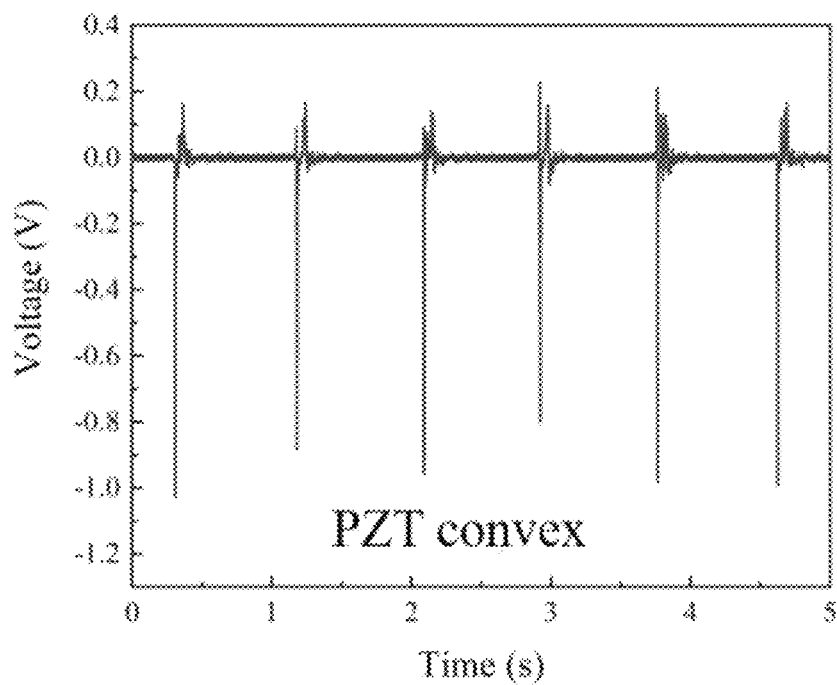
FIG. 15A shows piezoelectric performance under tapping stimulation of a PZT thin film coated on a convex stainless steel surface.
Figure 15B:
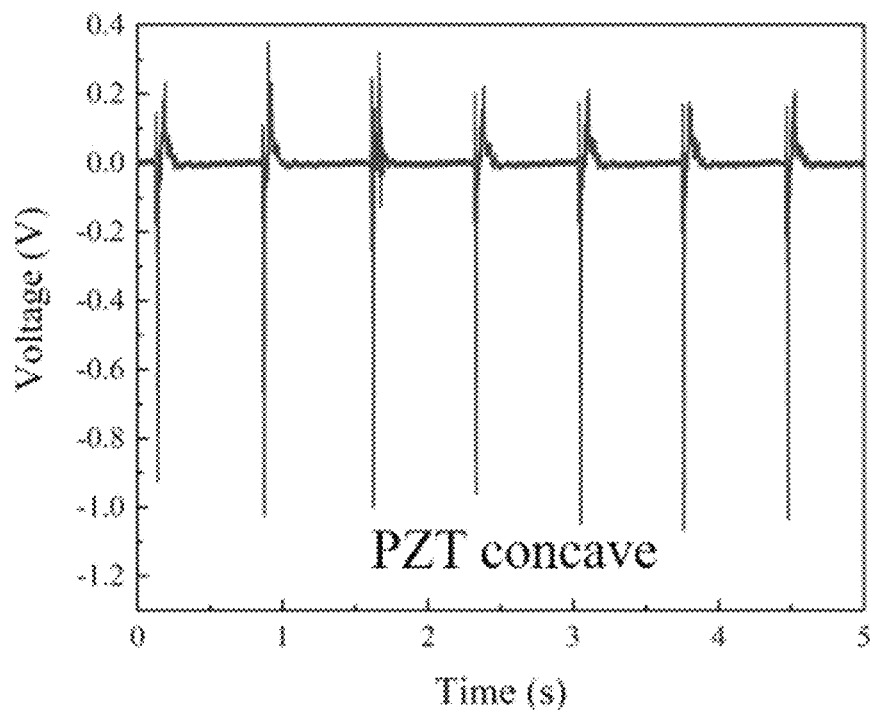
FIG. 15B shows piezoelectric performance under tapping stimulation of a PZT thin film coated on a concave stainless steel surface.

FIGS. 15A and 15B show the open-circuit piezoelectric output from PZT thin films coated on a convex stainless steel surface and a concave stainless steel surface respectively. The average output is 0.9 V for the PZT thin film coated on the convex surface and 0.9 V for the PZT thin film coated on the concave surface. The stimulation method was performed by tapping the surface by hand.

Figure 16A:
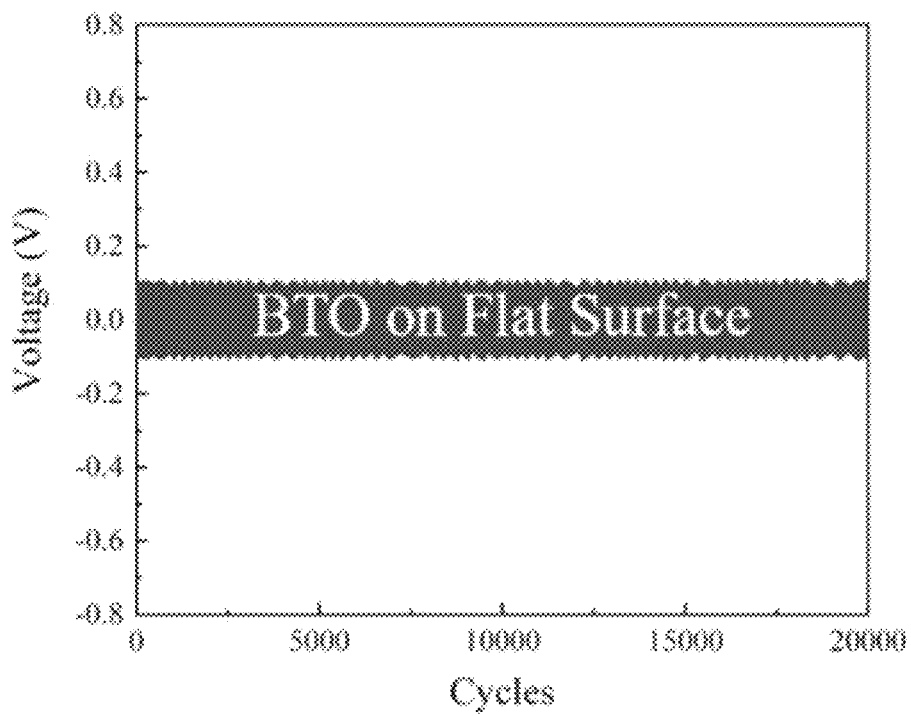
FIG. 16A shows a fatigue test result a BTO thin film coated on a flat stainless steel surface under tapping stimulation.
Figure 16B:
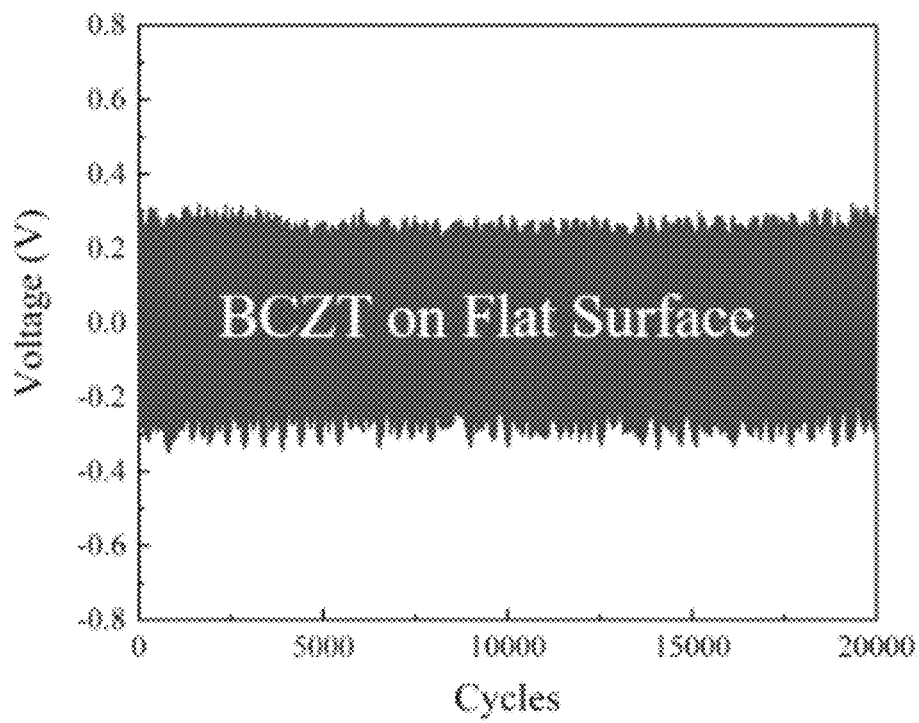
FIG. 16B shows a fatigue test result a BCZT thin film coated on a flat stainless steel surface under tapping stimulation.
Figure 16C:
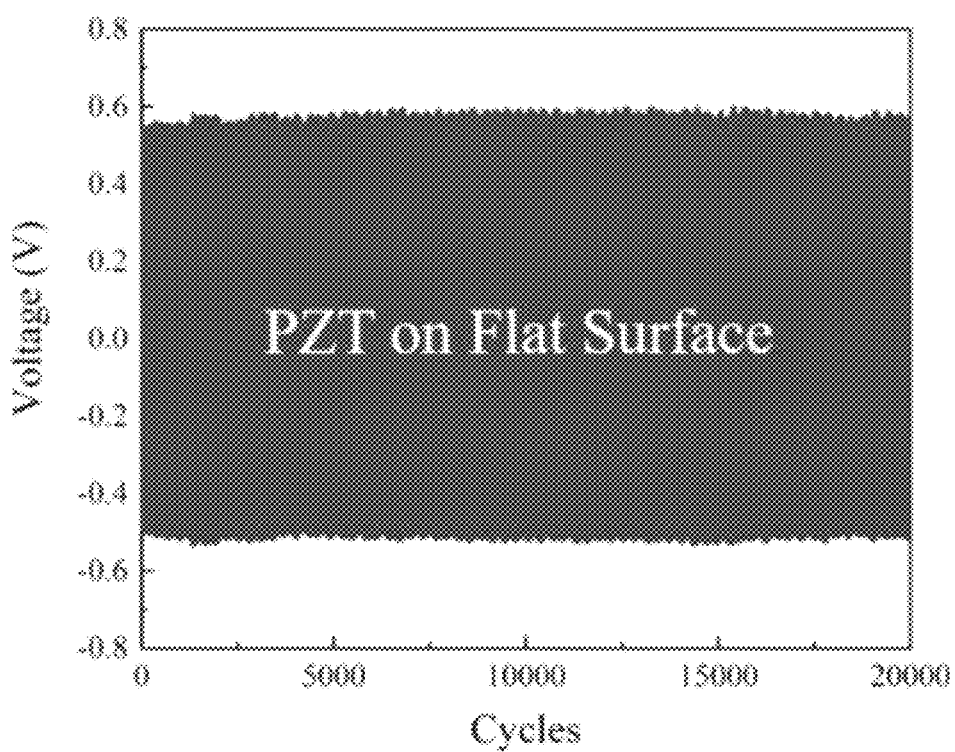
FIG. 16C shows a fatigue test result a PZT thin film coated on a flat stainless steel surface under tapping stimulation.

FIGS. 16A-16C show the mechanical fatigue performances of three samples including a BTO thin film, a BCZT thin film and a PZT thin film. To maintain stability and reliability during the measuring process, the piezoelectric thin films coated on stainless steel substrate with a flat surface were adopted in this experiment. The tapping hammer was connected to a vibrating shaker with a 40 Hz frequency. The tapping force was controlled with 5 N for each experiment. All the samples show stable output with at least 20,000 tapping cycles. FIG. 16A shows the average output of the BTO thin film with 0.1 V. FIG. 16B shows the average output of the BCZT thin film with 0.3 V. FIG. 16C shows the average output of the PZT thin film with 0.5 V. All three samples show high stability which has no significant performance degradation after 20,000 times of tapping.

Thus, it can be seen that an improved method and piezoelectric thin film have been disclosed which eliminates or at least diminishes the disadvantages and problems associated with prior art processes and devices. Piezoelectric thin films formed via spray coating, wiping and airflow drying can be coated on bent and even wrinkled substrates, which greatly expands the application scenarios. In addition, the coating area is no longer limited to a normal wafer size or device size, and any desired sizes is applicable. Furthermore, the uniformity of the piezoelectric thin film is significantly enhanced and the coating thickness is at least 500 nm for each round, which is larger than most traditional spin-coating processes.

Although the invention has been described in terms of certain embodiments, other embodiments apparent to those of ordinary skill in the art are also within the scope of this invention. Accordingly, the scope of the invention is intended to be defined only by the claims which follow.

What is claimed is:

1. A method for forming a piezoelectric film on a surface of a substrate with one or more curvatures, the method comprising:
   a) providing a sol for forming the piezoelectric film;
   b) spraying the sol onto the surface of the substrate with the one or more curvatures thereby forming a liquid film containing the sol on the surface;
   c) wiping the liquid film with a flattening tool for flattening the liquid film and removing excess sol from the liquid film such that the liquid film has one or more curvatures corresponding to the one or more curvatures of the substrate and a homogeneous thickness;
   d) drying the flattened liquid film thereby forming a gel layer;
   e) annealing the gel layer thereby forming a sublayer of the piezoelectric film with a thickness of at least 500 nm for each sublayer; and
   f) repeating the steps (b) to (e for forming one or more subsequent sublayers of the piezoelectric film with the same curvature(s) as the one or more curvatures of the preceding sublayer until the piezoelectric film is formed,
   wherein the sol comprises piezoceramic materials; the substrate is surface-treated to become lyophilic prior to said spraying the sol onto the surface of the substrate.

2. The method of claim 1, wherein the flattening tool is a roller, a blade or a brush.

3. The method of claim 2, wherein the step of wiping the liquid film comprises rolling the roller on the liquid film.

4. The method of claim 2, wherein the step of wiping the liquid film comprises sliding the blade or the brush on the liquid film.

5. The method of claim 1, wherein a distance is maintained between the surface and the flattening tool for defining a thickness of the flattened liquid film during the step of wiping the liquid film with the flattening tool.

6. The method of claim 5, wherein the distance is larger than 500 nm.

7. The method of claim 1, wherein the piezoelectric film has a thickness larger than 5 μm.

8. The method of claim 1, wherein the flattened liquid film is dried with a hot air gun.

9. The method of claim 1, wherein the surface of the substrate is treated by oxygen ions for modifying lylvophobicity of the surface prior to said spraying the sol onto the surface of the substrate.

10. The method of claim 1, wherein the surface of the substrate with the one or more curvatures comprises a concave surface, a convex surface, a wrinkled surface, or a curved surface.

11. The method of claim 1, wherein the piezoceramic materials comprises barium titanate ($BaTiO_3$), barium calcium zirconium titanate (BCZT), lead zirconate titanate (PZT), zinc oxide (ZnO) or lead magnesium niobate-lead titanate (PMN-PT).

12. The method of claim 1, wherein the substrate comprises a stainless steel, a titanium alloy or an aluminum alloy.

13. The method of claim 1, further comprising polarizing the piezoelectric film.

14. The method of claim 13, wherein the piezoelectric film is polarized by corona polarization or direct polarization.

15. The method of claim 1, further comprising forming one or more electrodes on the piezoelectric film.

16. The method of claim 15, wherein the one or more electrodes are formed by magnetron sputtering, thermal evaporation, electron beam evaporation, a silver paste or a conductive tape.

17. The method of claim 15, further comprising forming a protective layer on the one or more electrodes.

18. The method of claim 17, wherein the protective layer is formed by blade coating.

* * * * *